(12) United States Patent
Kim et al.

(10) Patent No.: US 10,247,794 B2
(45) Date of Patent: Apr. 2, 2019

(54) MAGNETIC FIELD MONITORING PROBE, MAGNETIC RESONANCE IMAGING APPARATUS INCLUDING THE SAME, AND METHOD FOR CONTROLLING THE SAME

(71) Applicants: SAMSUNG ELECTRONICS CO., LTD., Suwon-si (KR); UNIVERSITY-INDUSTRY COOPERATION GROUP OF KYUNG HEE UNIVERSITY, Yongin-si (KR)

(72) Inventors: Young Tae Kim, Seoul (KR); Eric Michel, Yongin-si (KR); Soo Yeol Lee, Seongnam-si (KR)

(73) Assignees: SAMSUNG ELECTRONICS CO., LTD., Suwon-si (KR); UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 190 days.

(21) Appl. No.: 15/461,632

(22) Filed: Mar. 17, 2017

(65) Prior Publication Data
US 2017/0269178 A1    Sep. 21, 2017

(30) Foreign Application Priority Data

Mar. 17, 2016 (KR) .......................... 10-2016-0031841

(51) Int. Cl.
*G01V 3/00* (2006.01)
*G01R 33/385* (2006.01)
(Continued)

(52) U.S. Cl.
CPC ........... *G01R 33/385* (2013.01); *G01R 33/30* (2013.01); *G01R 33/3802* (2013.01)

(58) Field of Classification Search
USPC ......................................................... 324/322
See application file for complete search history.

(56) References Cited

U.S. PATENT DOCUMENTS

| 3,771,055 A | * | 11/1973 | Anderson | .......... | G01R 33/3635 |
| | | | | | 324/322 |
| 6,456,078 B1 | * | 9/2002 | Iwata | .................. | G01R 33/307 |
| | | | | | 324/300 |

(Continued)

FOREIGN PATENT DOCUMENTS

| EP | 2515132 A1 | 10/2012 |
| JP | 63-128244 A | 5/1988 |

(Continued)

OTHER PUBLICATIONS

Communication dated Dec. 1, 2016, issued by the Korean Intellectual Property Office in corresponding Korean Application No. 10-2016-0031841.

(Continued)

*Primary Examiner* — Rodney E Fuller
(74) *Attorney, Agent, or Firm* — Sughrue Mion, PLLC

(57) ABSTRACT

A magnetic field monitoring probe includes a first container having a sample configured to emit a magnetic resonance (MR) signal included therein; a radio frequency (RF) coil inserted into the first container and configured to receive an MR signal emitted from the sample; and a second container surrounding the first container and having a matching liquid injected thereinto.

13 Claims, 10 Drawing Sheets

(51) Int. Cl.
*G01R 33/38* (2006.01)
*G01R 33/30* (2006.01)

(56) References Cited

U.S. PATENT DOCUMENTS

| | | | |
|---|---|---|---|
| 7,339,377 B2* | 3/2008 | Augustine | G01N 24/08 |
| | | | 324/312 |
| 2008/0111548 A1* | 5/2008 | Yamamoto | G01R 33/30 |
| | | | 324/322 |
| 2009/0295389 A1 | 12/2009 | Pruessmann et al. | |
| 2013/0234706 A1* | 9/2013 | Mandal | G01N 24/081 |
| | | | 324/303 |
| 2015/0241530 A1* | 8/2015 | Schmid | G01R 33/422 |
| | | | 324/322 |

FOREIGN PATENT DOCUMENTS

| | | |
|---|---|---|
| JP | 2008-20401 A | 1/2008 |
| JP | 2009-544432 A | 12/2009 |
| WO | 2011/037064 A1 | 3/2011 |

OTHER PUBLICATIONS

Communication dated Mar. 21, 2017, issued by the Korean Intellectual Property Office in corresponding Korean Application No. 10-2016-0031841.

\* cited by examiner

MAGNETIC FIELD MONITORING PROBE, MAGNETIC RESONANCE IMAGING APPARATUS INCLUDING THE SAME, AND METHOD FOR CONTROLLING THE SAME

CROSS-REFERENCE TO RELATED APPLICATION

This application claims priority from Korean Patent Application No. 10-2016-0031841, filed on Mar. 17, 2016 in the Korean Intellectual Property Office, the disclosure of which is incorporated herein by reference.

BACKGROUND

1. Field

Exemplary embodiments relate to a magnetic field monitoring probe, a magnetic resonance imaging (MRI) apparatus including the same, and a method for controlling the same.

2. Description of the Related Art

Generally, a medical imaging apparatus is an apparatus that images an inside of an object, acquires a medical image, and uses the acquired medical image in diagnosis. Specifically, the medical imaging apparatus captures and processes structural details, internal organs, fluid flow, etc. inside a body and shows the captured and processed result to a user.

A user such as a doctor may use a medical image output from a medical imaging apparatus and diagnose a health condition and a disease of a patient. Here, a patient's condition can be more accurately determined with higher precision of a medical image. Accordingly, research related to a method of more precisely acquiring a medical image has been carried out recently.

SUMMARY

One or more exemplary embodiments provide a magnetic field monitoring probe capable of more accurately monitoring a state of a magnetic field in the medical imaging apparatus.

In accordance with an aspect of an exemplary embodiment, a magnetic field monitoring probe includes a first container having a sample configured to emit a magnetic resonance (MR) signal included therein; a radio frequency (RF) coil inserted into the first container and configured to receive an MR signal emitted from the sample; and a second container surrounding the first container and having a matching liquid injected thereinto.

The first container and the second container are implemented in a spherical shape or a cylindrical shape.

Also, the RF coil is fixed to be placed at a center inside the first container by an insertion wire connected to the RF coil.

Also, the sample provided in the first container corresponds to any one of water, heavy water, and fluorine in a liquid state.

Also, a liquid that emits an MR signal at a resonance frequency different from the sample or does not emit an MR signal is used as the matching liquid.

Also, heavy water in a liquid state is used as the matching liquid.

Also, the RF coil is implemented in a solenoid form and is disposed at the center inside the first container.

In accordance with an aspect of an exemplary embodiment, an MRI apparatus includes a static magnetic field former configured to form a static magnetic field; a gradient magnetic field former configured to form a gradient magnetic field by applying a gradient to the static magnetic field; a radio frequency (RF) coil portion configured to radiate an RF signal; a magnetic field monitoring probe including a first container having a sample configured to receive the RF signal and emit an MR signal injected thereinto and a second container surrounding the first container, and configured to receive an MR signal emitted from the sample through an RF coil inserted into the first container; and a controller configured to monitor one or more of states of the static magnetic field and the gradient magnetic field on the basis of the received MR signal and perform a correction process on the basis of the monitoring result.

Here, a matching liquid for magnetic susceptibility matching is injected into the second container of the magnetic field monitoring probe.

Also, the controller generates a corrected current pulse on the basis of the monitoring result and controls a gradient magnetic field to be formed on the basis of the generated current pulse.

In accordance with an aspect of an exemplary embodiment, a method of manufacturing a magnetic field monitoring probe, the method includes injecting a sample configured to emit a magnetic resonance (MR) signal into a first container; dipping a radio frequency (RF) coil configured to receive an MR signal emitted from the sample in the first container; and injecting a matching liquid into a second container surrounding the first container.

The dipping includes connecting an insertion wire to the RF coil to fix the RF coil to be placed at a center inside the first container.

Also, the injecting of the matching liquid into the second container includes selecting any one of liquids that emit an MR signal at a resonance frequency different from the sample or does not emit an MR signal as the matching liquid, and injecting the selected matching liquid into the second container.

In accordance with an aspect of an exemplary embodiment, a method of controlling an MRI apparatus includes forming a static magnetic field; forming a gradient magnetic field by applying a gradient to the static magnetic field; radiating a radio frequency (RF) signal; when a sample injected into a magnetic field monitoring probe receives the RF signal and emits an MR signal, receiving the emitted MR signal through an RF coil dipped in the sample; and monitoring one or more of states of the static magnetic field and the gradient magnetic field on the basis of the received MR signal and performing a correction process on the basis of the monitoring result.

Here, in restoring a medical image on the basis of the received MR signal, the performing includes performing the correction process in which a monitoring result is reflected and corrected or a form of a current pulse applied in forming the gradient magnetic field is corrected.

According to present disclosure, it is possible to more accurately monitor the state of a magnetic field by a monitoring probe having a higher monitoring performance.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
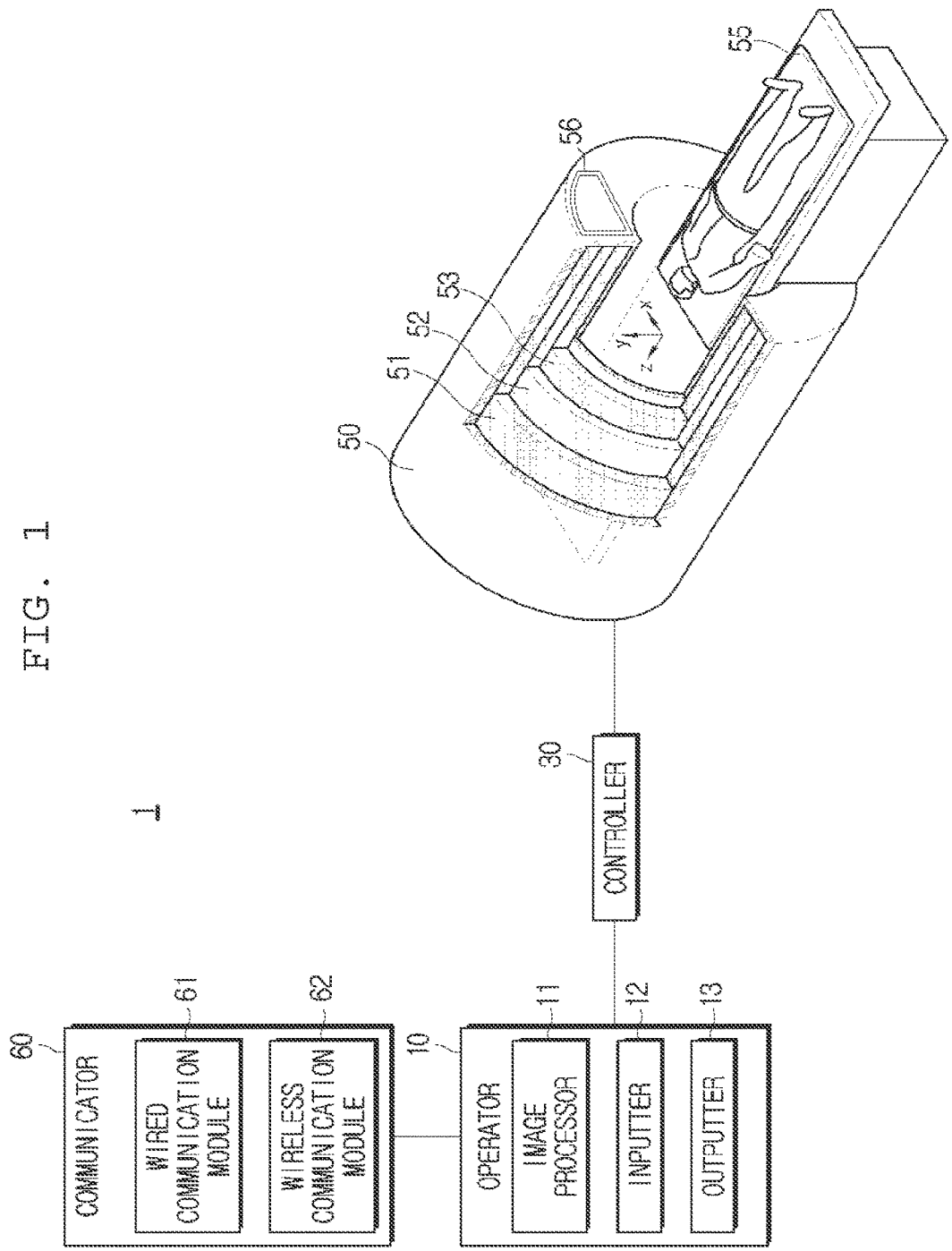
FIG. 1 is a schematic view of an MRI system according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

The terms "part" and "portion" used herein may be implemented with software or hardware. A plurality of "parts" or "portions" may be implemented as a single unit or element according to embodiments, or a single "part" or "portion" may include a plurality of elements.

An "object" herein refers to an object to be captured and may include a human being, an animal, or a part thereof. For example, an object may include a part of a body (an organ), a phantom, or the like.

An MRI system acquires an MR signal and restructures the acquired MR signal into an image. An MR signal refers to a radio frequency (RF) signal emitted from an object.

An MRI system has a main magnet forming a static magnetic field, and aligns a magnetic dipole moment direction of a particular atomic nucleus of an object placed in the static magnetic field to a direction of the static magnetic field. A gradient coil may apply a gradient signal to the static magnetic field, form a gradient magnetic field, and induce a resonance frequency to be different for each portion of the object.

An RF coil may radiate an RF signal corresponding to a resonance frequency of a portion desired for image acquisition. Also, as a gradient magnetic field is formed, the RF coil may receive MR signals having different resonance frequencies emitted from various portions of an object. By the above steps, the MRI system acquires an image from MR signals by using an image restoration technique.

FIG. 1 is a schematic view of an MRI system. Referring to FIG. 1, an MRI system 1 may include an operator 10, a controller 30, and a scanner 50. The controller 30 may be independently implemented as illustrated in FIG. 1. Alternatively, the controller 30 may be divided into a plurality of elements and be included in each of the elements of the MRI system 1. Hereinafter, each of the elements will be described in detail.

The scanner 50 may have a shape in which an inner space is hollow so that an object may be inserted therein (e.g., a shape of a bore). A static magnetic field and a gradient magnetic field are formed in the inner space of the scanner 50, and an RF signal is radiated thereto. A magnetic field described below includes both a static magnetic field and a gradient magnetic field, and is simply referred to as a magnetic field when distinguishing a type of a magnetic field, such as a static magnetic field and a gradient magnetic field, is not necessary in description.

The scanner 50 may include a static magnetic field former 51, e.g., a static magnetic field generator, a gradient magnetic field former 52, e.g., a gradient magnetic field generator, an RF coil portion 53, a table 55, and a display 56. The static magnetic field former 51 forms a static magnetic field for aligning directions of magnetic dipole moments of atomic nuclei included in an object to a direction of the static magnetic field. The static magnetic field former 51 may be implemented with a permanent magnet or may also be implemented with a superconducting magnet using a cooling coil.

The gradient magnetic field former 52 is connected to the controller 30. The gradient magnetic field former 52 applies a gradient to the static magnetic field according to a control signal received from the controller 30 and forms a gradient magnetic field. The gradient magnetic field former 52 includes an X-coil, a Y-coil, and a Z-coil forming a gradient magnetic field in an X-axis direction, a Y-axis direction, and a Z-axis direction perpendicular to one another, and generates a gradient signal corresponding to a capturing position to induce a resonance frequency to be different for each portion of the object.

The RF coil portion 53 may be connected to the controller 30, radiate an RF signal to the object according to a control signal received from the controller 30, and receive an MR signal emitted from the object. The RF coil portion 53 may transmit an RF signal having a frequency identical to a precession frequency of an atomic nucleus performing the precession toward the object having the atomic nucleus, stop transmitting the RF signal, and receive an MR signal emitted from the object.

The RF coil portion 53 may be separately implemented as a transmission RF coil configured to generate an electromagnetic wave having an RF corresponding to a type of an atomic nucleus, and a reception RF coil configured to receive an electromagnetic wave emitted from the atomic nucleus. Alternatively, the RF coil portion 53 may also be implemented as a single RF transmission-reception coil having both transmitting and receiving functions.

Also, a separate coil may be mounted to the object, in addition to the RF coil portion 53. For example, according to a capturing portion or a mounting portion, a head coil, a spine coil, a torso coil, a knee coil, and the like may be used as the separate coil. A receiving sensitivity is increased as a distance between a capturing portion and an RF coil configured to receive an MR signal is closer. Consequently, as will be described below, a magnetic field monitoring probe 100 (see FIG. 2) may increase the receiving sensitivity and improve monitoring performance by shortening a distance between a sample emitting an MR signal and an RF coil receiving the MR signal. This will be described in detail below.

The display 56 may be provided at an outside and/or an inside of the scanner 50. The display 56 may be controlled by the controller 30 and provide a user or an object with information related to medical imaging.

Also, the scanner 50 may include an object monitoring information acquirer configured to acquire and transmit monitoring information related to a state of an object. For example, an object monitoring information acquirer (not illustrated) may acquire monitoring information related to an object from a camera (not illustrated) configured to acquire movement, position, and the like of the object, a spirometer (not illustrated) configured to measure a breath strength of the object, an electrocardiogram (ECG) meter (not illustrated) configured to measure ECG of the object, or a thermometer (not illustrated) configured to measure body temperature of the object, and transmit the acquired monitoring information to the controller 30. Accordingly, the controller 30 may use the monitoring information related to the object and control an operation of the scanner 50. Hereinafter, the controller 30 will be described.

The controller 30 may control an overall operation of the scanner 50.

The controller 30 may control a sequence of signals formed inside the scanner 50. The controller 30 may control the gradient magnetic field former 52 or the RF coil portion 53 according to a pulse sequence received from the operator 10 or a designed pulse sequence.

A pulse sequence includes all information required to control the gradient magnetic field former 52 and the RF coil portion 53. For example, a pulse sequence may include information related to intensity, duration, timing and the like of a pulse signal applied to the gradient magnetic field former 52.

The controller 30 may control formation of a gradient magnetic field by the gradient magnetic field former 52 by controlling a waveform generator (not illustrated) configured to generate a gradient waveform, i.e., a current pulse, according to a pulse sequence and a gradient amplifier (not illustrated) configured to amplify a generated current pulse and transmit the amplified current pulse to the gradient magnetic field former 52.

Here, a current pulse may be distorted due to various factors. For example, a current pulse may be distorted due to various external factors such as a characteristic of a gradient amplifier, a magnetic field formed inside the scanner 50, and an RF signal radiated by the RF coil portion 53, and thus, a gradient magnetic field formed by the gradient magnetic field former 52 may also be distorted.

Accordingly, as will be described below, the controller 30 enables a gradient magnetic field of a desired shape to be formed, by monitoring a state of a magnetic field, e.g., a gradient magnetic field, using the magnetic field monitoring probe 100 (see FIG. 2) and performing a process of correcting a shape or a wave form of a current pulse by using the monitoring result.

The controller 30 may control operation of the RF coil portion 53. For example, the controller 30 may supply an RF pulse of a resonance frequency to the RF coil portion 53 and radiate an RF signal, and receive an MR signal received by the RF coil portion 53. The controller 30 may control an operation of a switch (e.g., a transmit/receive (T/R) switch) capable of controlling transmitting and receiving directions by a control signal and control RF signal radiation and MR signal reception according to an operation mode.

The controller 30 may control movement of the table 55 on which an object is placed. Before capturing is performed, the controller 30 may move the table 55 in advance corresponding to a capturing portion of an object.

The controller 30 may control the display 56. For example, the controller 30 may control on/off of the display 56, a screen displayed on the display 56, or the like by using a control signal.

The controller 30 may be implemented with a memory (not illustrated) configured to store an algorithm for controlling operations of elements within the MRI system 1 and data in a program form, and a processor (not illustrated) configured to perform the above-described operations by using the data stored in the memory. The memory and the processor may be implemented with separate chips. Alternatively, the memory and the processor may also be implemented with a single chip.

The operator 10 may control an overall operation of the MRI system 1. The operator 10 may include an image processing unit 11, e.g., an image processor, an inputter 12, e.g., an input unit, and an outputter 13, e.g., an output device.

The image processing unit 11 may use the memory to store an MR signal received from the controller 30 and use an image processor to apply an image restoration technique, thereby generating image data related to the object from the stored MR signal.

For example, when a k-space (also referred to as a Fourier space or a frequency space, for example) of the memory is filled with digital data and k-space data is completed, the image processing unit 11 may apply various image restoration techniques by an image processor (e.g., take inverse Fourier transform of the k-space data) and restore the k-space data into image data.

Also, various types of signal processing applied to an MR signal by the image processing unit 11 may be performed in parallel. For example, a plurality of MR signals received by a multi-channel RF coil may be processed in parallel to be restored into image data. The image processing unit 11 may store the restored image data in the memory. Alternatively, as will be described below, the controller 30 may store the restored image data in an external server through a communicator 60.

Here, in generating image data by applying an image restoration technique, the image processing unit 11 may reflect a monitoring result from the magnetic field monitoring probe 100 (see FIG. 2) and generate image data with less distortion. This will be described in detail below.

The inputter 12 may receive a control command related to the overall operation of the MRI system 1 from a user. For example, the inputter 12 may receive object information, parameter information, scan conditions, pulse sequence information, and the like from the user. The inputter 12 may be implemented with a keyboard, a mouse, a trackball, a voice recognizer, a gesture recognizer, a touchscreen, or the like.

The outputter 13 may output image data generated by the image processing unit 11. Also, the outputter 13 may output a user interface (UI) configured so that the user may receive a control command related to the MRI system 1. The outputter 13 may be implemented with a speaker, a printer, a display, or the like.

Although the operator 10 and the controller 30 are illustrated as separate objects in FIG. 1, the operator 10 and the controller 30 may also be included in a single apparatus as described above. Also, processes performed by each of the operator 10 and the controller 30 may be performed by other objects. For example, the image processing unit 11 may convert an MR signal received by the controller 30 into a digital signal, or the controller 30 may directly convert the received MR signal.

Also, the MRI system 1 includes the communicator 60 and may be connected via the communicator 60 to an external apparatus (not illustrated) (e.g., a server, a medical apparatus, a portable device (a smartphone, a tablet personal computer (PC), a wearable device, and the like)).

The communicator 60 may include one or more elements that enable communication with an external apparatus, and may include, for example, one or more of a short-range communication module (not illustrated), a wired communication module 61, and a wireless communication module 62.

The communicator 60 may receive a control signal and data from an external apparatus and transmit the received control signal to the controller 30 so that the controller 30 controls the MRI system 1 according to the received control signal.

Alternatively, the controller 30 may transmit a control signal via the communicator 60 to an external apparatus and control the external apparatus according to the control signal of the controller.

For example, the external apparatus may process data of the external apparatus according to the control signal of the controller 30 received via the communicator 60.

A program capable of controlling the MRI system 1 may be installed in the external apparatus, and the program may include instructions for performing some or all operations of the controller 30.

The program may be installed in advance in the external apparatus, or may be downloaded from a server providing applications and installed by a user of the external apparatus. The server providing applications may include a recording medium having a corresponding program stored therein.

A change may occur in a static magnetic field formed by the static magnetic field former 51. For example, because a permanent magnet is highly sensitive to temperature, a change in a level of several tens of ppm may occur within an hour by temperature in a static magnetic field formed by a permanent magnet. Particularly, when a coil of the gradient magnetic field former 52 is operated, a change may occur in the static magnetic field due to heat generated by the coil. Also, temporal/spatial changes of the static magnetic field may occur due to a temperature change of a piece of iron installed for shimming of the magnetic field inside the scanner 50.

In other words, temporal/spatial changes in the static magnetic field formed by the static magnetic field former 51 may occur due to various reasons such as heat generation as well as a characteristic of a magnet itself forming the static magnetic field, and the temporal/spatial changes may have a negative influence on uniformity of the magnetic field.

In another example, although a change in a level of 0.05 ppm occurs within an hour in a static magnetic field formed by a superconducting magnet, and the static magnetic field is more stable than that formed by a permanent magnet, distortion of a medical image may be brought about when a capturing time is long.

Furthermore, a change may occur in the static magnetic field due to an eddy current formed by the gradient magnetic field former 52. The eddy current may cause a spatial change as well as a temporal change in the static magnetic field.

Also, although all organs in a human body generally correspond to being nonmagnetic, very slight differences in terms of magnetism exist according to types of organs. For example, when a space in which air stays is present as in a case of a lung, a change in a static magnetic field may occur due to a difference between magnetic susceptibility of air up to about 9 ppm and magnetic susceptibility of a biological tissue.

In other words, when an object is a human body, temporal and spatial changes may occur in a magnetic field also due to various physiological movements, such as heart beating and breathing, that occur within a human body when capturing the human body.

Consequently, to acquire a more accurate medical image, monitoring temporal and spatial changes of a magnetic field that occur due to various reasons and a correction process based on the monitoring result are required. Hereinafter, a magnetic field monitoring probe capable of more accurately monitoring temporal and spatial changes of a magnetic field will be described.

Figure 2:
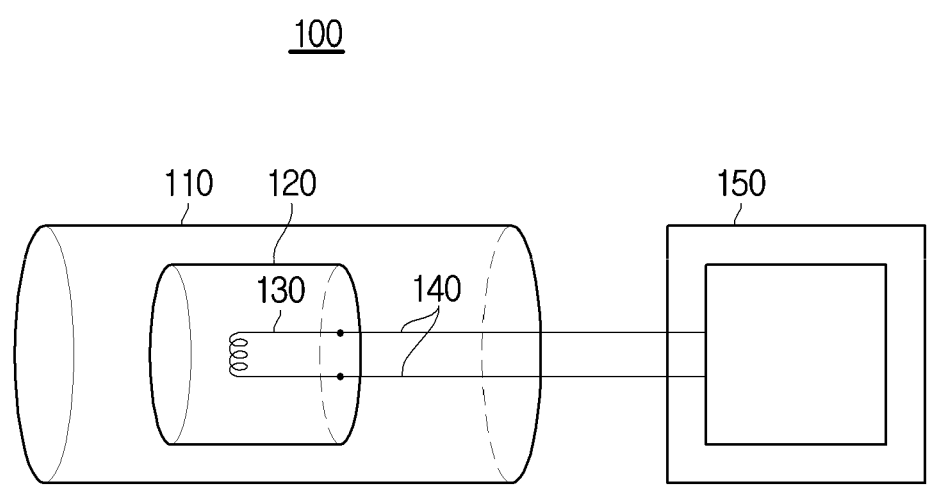
FIG. 2 is a view schematically illustrating an exterior of a magnetic field monitoring probe according to an exemplary embodiment.
Figure 3:
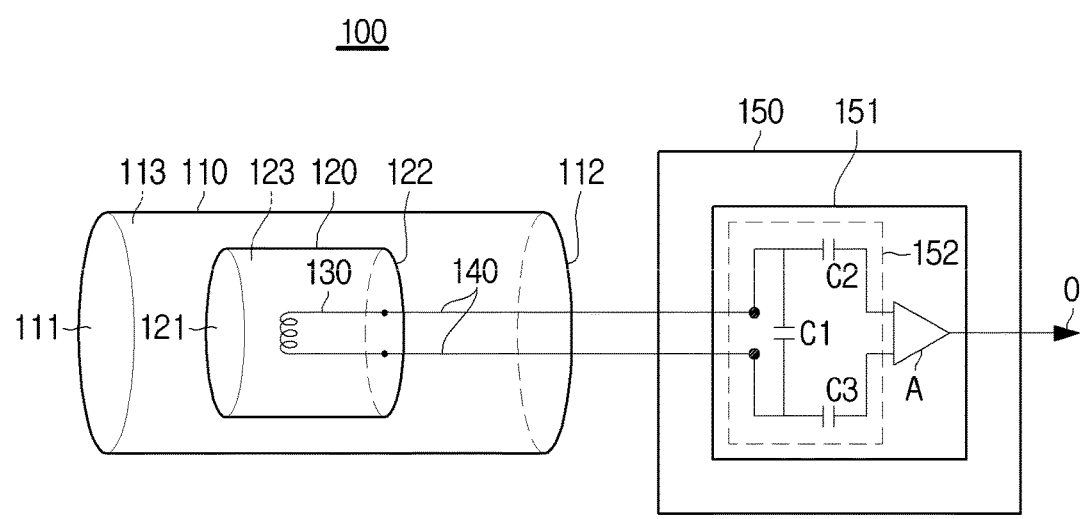
FIG. 3 is a more detailed view of the magnetic field monitoring probe according to an exemplary embodiment.

FIG. 2 is a view schematically illustrating an exterior of a magnetic field monitoring probe according to an exemplary embodiment, and FIG. 3 is a more detailed view of the magnetic field monitoring probe according to an exemplary embodiment. Hereinafter, FIGS. 2 and 3 will be described together to prevent overlapping descriptions.

The magnetic field monitoring probe 100 may include a first container 120 having a sample 123 configured to emit an MR signal injected therein and an RF coil 130 inserted thereinto, a second container 110 surrounding the first container 120 and having a matching liquid 113 injected in an inner space thereof, and an electronic circuit 150 configured to transmit and receive a signal to and from an external device. Hereinafter, each of the elements of the magnetic field monitoring probe 100 will be described.

The second container 110 may include plugs 111 and 112 configured to prevent the matching liquid 113 injected in the inner space thereof from leaking. Here, although the plugs 111 and 112 may be provided at both sides of the second container 110 as illustrated in FIGS. 2 and 3, embodiments are not limited thereto, and the plugs 111 and 112 may also be provided at any one side of the second container 110.

Also, as illustrated in FIGS. 2 and 3, an insertion wire 140 configured to connect the RF coil 130 inserted into the first container 120 to the electronic circuit 150 by passing through the plug 112 of the second container 110 may be inserted into the second container 110.

However, the insertion wire 140 may connect the RF coil 130 to the electronic circuit 150 by passing through a region of the second container 110 other than a region thereof at which the plugs 111 and 112 are provided. Also, the insertion wire 140 may pass through any one of the plugs 111 and 112 of the second container 110 to connect the RF coil 130 to the electronic circuit 150, and a design of the insertion wire 140 is not limited to passing through the plug 112 as illustrated in FIGS. 2 and 3.

The second container 110 may be formed of various solid materials. Here, although a solid material having magnetic susceptibility that is identical or similar to that of the sample 123 may be used as the solid material, embodiments are not limited thereto. For example, the second container 110 may be formed of a mixture in which a foreign material for matching magnetic susceptibility is mixed with a solid material.

According to an exemplary embodiment, the second container 110 may be formed of a solid material such as epoxy or silicone with which a shape can be easily manufactured, or may also be formed of a mixture in which a foreign material for matching magnetic susceptibility is mixed with epoxy or silicone. The plugs 111 and 112 may also be formed of any material, such as a solid material including epoxy or silicone or a mixture in which a foreign material is mixed with epoxy or silicone, as long as the material is able to prevent the matching liquid 113 from leaking and maintain uniformity of a magnetic field.

Meanwhile, even when the difference between the magnetic susceptibility of air and the magnetic susceptibility of the sample 123 is very small, a magnetic field may become non-uniform when air is introduced thereinto and air bubbles are generated. The plugs 111 and 112 serve to prevent air from being introduced and air bubbles from being formed as well as prevent the matching liquid 113 from leaking.

The matching liquid 113 may be injected into the second container 110. The matching liquid 113 serves to ease or minimize an influence from an outside to the sample 123. For example, the matching liquid 113 serves to match impedance or match magnetic susceptibility between the sample 123 and an outside of the second container 110 in which the sample 123 is provided.

In one embodiment, when water is used as the sample 123, because water is a diamagnetic substance whereas outside air is a paramagnetic substance, a magnetic field may become non-uniform due to the difference between magnetic susceptibilities. Here, magnetic susceptibilities of water and outside air should match to maintain uniformity of the magnetic field. Consequently, a liquid used as the matching liquid 113 may be determined according to a characteristic of the sample 123. Hereinafter, liquids that may be used as the matching liquid 113 will be described.

Various liquids may be used as the matching liquid 113. For example, a liquid which does not emit an MR signal may be used as the matching liquid 113. In one embodiment, when an MR signal is emitted from the matching liquid 113, the emitted MR signal is also received through the RF coil 130. Here, because a magnetic field may become different for each inner region of the magnetic field monitoring probe 100 and the RF coil 130 combines all of the received MR signals and transmits the combined signal, distortion may occur in a restored medical image.

Accordingly, because the RF coil 130 receives an MR signal emitted from the matching liquid 113 as well as an MR signal emitted from the sample 123, it becomes difficult to derive an accurate monitoring result. Consequently, a liquid from which an MR signal is not emitted due to excitation of an atomic nucleus may be used as the matching liquid 113.

Alternatively, a liquid having a resonance frequency different from the sample 123 may be used as the matching liquid 113. For example, even when both the sample 123 and the matching liquid 113 receive an RF signal inside the scanner 50 in which a magnetic field is formed, only an MR signal emitted from the sample 123 may be extracted by selectively receiving an MR signal or filtering when the sampler 123 and the matching liquid 113 have different resonance frequencies. Accordingly, the controller 30 may use an MR signal emitted from the sample 123 to perform a correction process. The correction process will be described in detail below.

According to an exemplary embodiment, when water is used as the sample 123, heavy water may be used as the matching liquid 113. Here, because magnetic susceptibility of water is −9.03 ppm and magnetic susceptibility of heavy water is −9.01 ppm, an advantage exists in terms of magnetic susceptibility matching.

Also, a Larmor frequency of water is 42.52 MHz/Tesla whereas a Larmor frequency of heavy water is 10.7 MHz/Tesla. Accordingly, when an atomic nucleus of water is excited and an MR signal is emitted, an atomic nucleus of heavy water may not be excited and an MR signal may not be emitted. Consequently, because the RF coil 130 may receive the MR signal emitted only from water, i.e., the sample 123, the controller 30 may derive a more accurate monitoring result from the MR signal as will be described below.

A solid material is used as a matching substance that serves as a buffer. For example, magnetic susceptibility of a mixture may be adjusted when a relative mixing amount is adjusted between a liquid state epoxy and a foreign material having magnetic susceptibility different from that of the epoxy as described above.

However, fine air bubbles may be generated in a mixture during a process in which a mixture in a high-temperature liquid state is cooled and solidified. The air bubbles not only generate noise but also influence uniformity of a magnetic field inside the magnetic field monitoring probe 100.

Also, when a mixture is not evenly mixed, magnetic susceptibility of the mixture may not be constant, and this may cause a magnetic field to be non-uniform. Accordingly, an attenuation time constant of an MR signal is shortened, and a problem occurs in that magnetic field monitoring performance is degraded.

On the other hand, the matching liquid 113 in a liquid state is injected into the second container 110 of the magnetic field monitoring probe 100 according to an exemplary embodiment such that a manufacturing process is further simplified and problems such as air bubble generation and non-uniformity of magnetic susceptibilities can be overcome at the same time. Accordingly, the magnetic field monitoring probe 110 according to an exemplary embodiment may increase receiving sensitivity of an MR signal as well as maintain uniformity of a magnetic field and have a long attenuation time constant, thereby being able to perform monitoring more smoothly.

Particularly, when a low gradient is applied to a gradient magnetic field, a disadvantage exists in that monitoring a small change in a gradient magnetic field becomes difficult as a noise level is higher. Here, because the magnetic field monitoring probe 100 according to an exemplary embodiment is able to increase a signal-to-noise ratio (SNR) by dipping the RF coil 130 inside the sample 123 to decrease an average distance between the RF coil 130 and the sample 123, an advantage exists in that even small changes may be monitored.

Meanwhile, referring to FIG. 2, the RF coil 130 may pass through the second container 110 and the first container 120 via the insertion wire 140 and be connected to the electronic circuit 150. The electronic circuit 150 may serve to transmit an MR signal received through the RF coil 130 to an external device or another element of the MRI system 1.

For example, the electronic circuit 150 may include an impedance matching circuit 152 and a high frequency amplifier A as illustrated in FIG. 3. In one embodiment, the electronic circuit 150 may include a printed circuit board (PCB) or a flexible PCB (FPCB), and the impedance matching circuit 152 and the high frequency amplifier A may be mounted on the PCB or the FPCB.

The impedance matching circuit 152 may perform matching between an impedance of the RF coil 130 and an input impedance of the high frequency amplifier A. In other words, the impedance matching circuit 152 serves to match the impedance of the RF coil 130 and the input impedance of the high frequency amplifier A to be the same or have a difference within a predetermined range. For example, when an input impedance of the high frequency amplifier A is 50Ω, the impedance matching circuit 152 may be implemented to make an impedance of the RF coil 130 be equal to 50Ω, i.e., to match impedances.

The impedance matching circuit 152 may be implemented with various known electronic devices, electronic parts, and the like. For example, the impedance matching circuit 152 may be implemented by arranging a plurality of capacitors C1, C2, and C3 in series or in parallel as illustrated in FIG. 3. Arrangement of the plurality of capacitors C1, C2, and C3 is not limited to that illustrated in FIG. 3, and the number, arrangement, and the like of capacitors may vary depending on capacity of a capacitor being mounted, an impedance of the RF coil 130, an input impedance of the high frequency amplifier A and the like.

The high frequency amplifier A may amplify a received MR signal. The high frequency amplifier A may prevent an MR signal from being distorted due to noise by amplifying the MR signal and transmitting the amplified MR signal to the controller 30. An MR signal received through the RF coil 130 may pass through the impedance matching circuit 152 and the high frequency amplifier A and be transmitted to an external device or another element in the MRI system 1 via an output end 0.

Meanwhile, magnetic susceptibilities of electronic parts that form the impedance matching circuit 152 and the high frequency amplifier A being different from magnetic susceptibility of air may cause a magnetic field to become non-uniform. Consequently, materials that form the impedance matching circuit 152 and the high frequency amplifier A may be non-magnetic materials.

Also, a length of the insertion wire 140 may be designed in advance so that the electronic circuit 150 and the first container 120 are spaced apart by a predetermined distance or more, and may be designed not to influence an inside of the second container 110.

The electronic circuit 150 may include an RF shield 151. Various types of electromagnetic waves emitted from electronic parts that form the high frequency amplifier A and the impedance matching circuit 152 may affect a magnetic field. Consequently, the RF shield 151 is provided in the electronic circuit 150 to shield electronic waves emitted from electronic parts and the like that form the high frequency amplifier A and the impedance matching circuit 152. In this way, SNR performance may be improved and an attenuation time constant of an MR signal may be increased.

For example, the RF shield 151 may be implemented to surround the impedance matching circuit 152 and the high frequency amplifier A. Accordingly, the RF shield 151 may serve to shield an RF signal emitted from the impedance matching circuit 152 and the high frequency amplifier A and may minimize an influence on a material injected into the first container 120 and the second container 110.

Meanwhile, various liquids capable of emitting an MR signal may be used as the sample 123 injected into the first container 120. For example, water, heavy water, heavy hydrogen, fluorine solution, and the like may be used as the sample 123. Particularly, Larmor frequencies of heavy hydrogen and fluorine are different from a Larmor frequency of hydrogen which is abundant inside a human body. Consequently, when heavy hydrogen and fluorine are used as the sample 123, an advantage exists in that acquiring a medical image related to a human body and monitoring a state of a magnetic field can be simultaneously performed.

An injectable amount of sample 123 increases as an inner space of the first container 120 is larger. However, a magnetic field is slightly different for each position even in the inner space of the first container 120. Accordingly, as the inner space of the first container 120 is larger and the injectable amount of sample 123 is larger, an interference between samples 123 may occur, and an attenuation time constant may be shortened. Consequently, a size of the first container 120 in which the sample 123 is injected may be designed in advance in consideration of an interference between samples 123.

Hereinafter, a difference according to whether the RF coil 130 is inserted into the first container 120 will be described in more detail.

Figure 4:
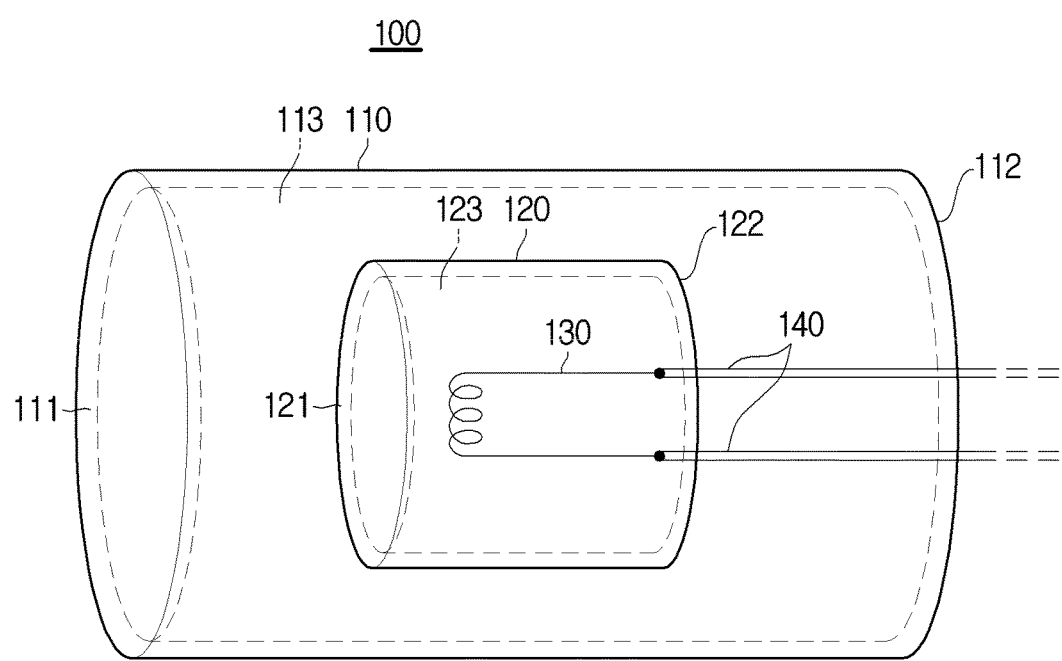
FIG. 4 is a view illustrating a first container and a second container of the magnetic field monitoring probe according to an exemplary embodiment in more detail.
Figure 5:
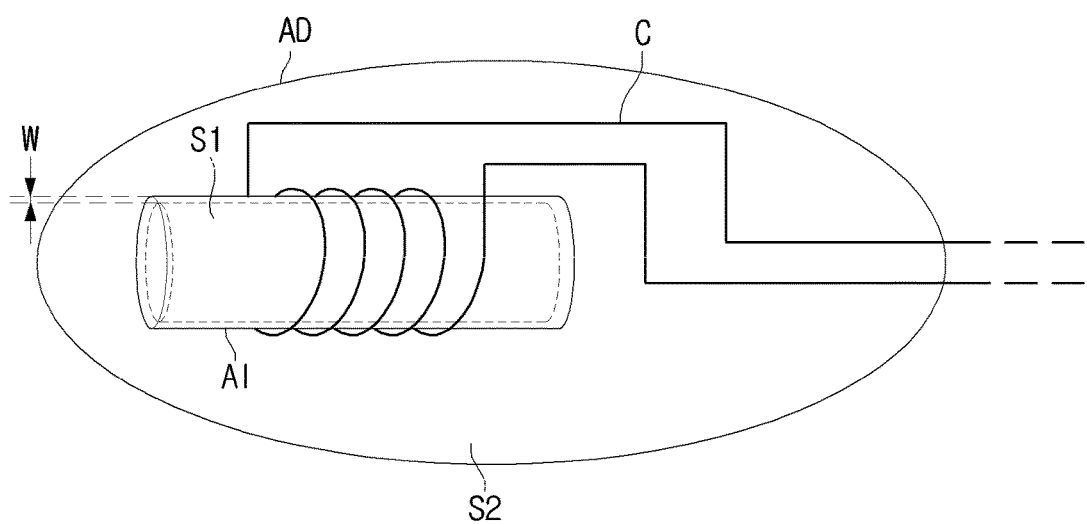
FIG. 5 is a view schematically illustrating a magnetic field monitoring probe in which an RF coil is provided outside the first container according to an exemplary embodiment.

FIG. 4 is a view illustrating a first container and a second container of the magnetic field monitoring probe according to an exemplary embodiment in more detail, and FIG. 5 is a view schematically illustrating a magnetic field monitoring probe in which an RF coil is provided outside the first container according to an exemplary embodiment. Hereinafter, FIGS. 4 and 5 will be described together to prevent overlapping descriptions.

Referring to FIG. 4, the RF coil 130 may be inserted into the first container 120. Accordingly, the RF coil 130 may be dipped in the sample 123 injected into the first container 120. On the other hand, referring to FIG. 5, an RF coil C may be implemented in a form of surrounding a container A1 corresponding to the first container 120.

For example, receiving sensitivity of a signal is higher as a distance between a capturing portion and a coil is closer. In one embodiment, a head coil, a knee coil, and the like may be mounted at a capturing portion depending on the capturing portion to increase receiving sensitivity. By the same principle as above, receiving sensitivity of an MR signal may be higher as an average distance between the RF coil 130 and the sample 123 is closer.

Here, due to dipping the RF coil 130 into the sample 123, an average distance between the RF coil 130 and the sample 123 in FIG. 4 is shorter than an average distance between the RF coil C and a sample S1 injected into the container A1 in FIG. 5. Accordingly, noise of an MR signal received through the RF coil 130 of FIG. 4 is decreased, and an attenuation time constant thereof is increased.

Also, in the case of FIG. 5, because a width W of the container A1 itself should also be taken into consideration in calculating the average distance, a disadvantage exists in that a manufacturing process becomes complicated. On the other hand, because the RF coil 130 is inserted into the first container 120 in the magnetic field monitoring probe 100 according to an exemplary embodiment, a width of the first container 120 is excluded from the average distance such that a manufacturing process can be further simplified and a manufacturing cost can be reduced.

The RF coil 130 may be implemented in a solenoid form as illustrated in FIG. 4. When the RF coil 130 is implemented in a solenoid form, an advantage exists in that receiving sensitivity is high. However, an implementation form of the RF coil 130 is not limited to the above, and the RF coil 130 may be implemented in other various known forms.

The RF coil 130 may be implemented with a conductive material. According to an exemplary embodiment, the RF coil 130 may be implemented with a conductive material having magnetic susceptibility that is similar to that of the sample 123.

For example, when water is used as the sample 123, copper having magnetic susceptibility (about −9.1 ppm) that is not much different from that of water (about −9.03 ppm) may be employed as a material for implementing the RF coil 130. In this case, because a difference between magnetic susceptibilities of the sample 123 and the RF coil 130 is small, an advantage exists in that uniformity of a magnetic field can be maximally maintained even without attaching a separate magnetic susceptibility matching material between the RF coil 130 and the sample 123.

The RF coil 130 may be fixed to be disposed at the center of an inside of the first container 120. However, because the RF coil 130 is implemented with a thin conductive material, a mechanical strength thereof may be weak, and a position thereof may be changed. To overcome this, referring to FIG. 4, the insertion wire 140 may be implemented to be thicker than the RF coil 130 to fix the RF coil 130 at the center of the first container 120. In other words, the mechanical strength of the RF coil 130 may be reinforced by designing the insertion wire 140 to be thicker than the RF coil 130. Accordingly, even when the RF coil 130 is not implemented in the form of surrounding the first container 120 as illustrated in FIG. 5, the RF coil 130 may be implemented to be fixed to a particular position.

For example, the RF coil 130 may be implemented with a copper wire having a diameter of about 0.1 to 0.2 mm. Here, by implementing the insertion wire 140 with a copper wire having a diameter of about 1 mm, the RF coil 130 may be implemented to be fixed to the center of the first container 120.

An inside of a second container AD of FIG. 5 corresponding to the second container 110 of FIG. 4 may be implemented with a solid material S2. The solid material S2 may be formed by solidifying a material in a high-temperature liquid state. However, because problems such as air bubble generation due to the solidifying process and non-uniformity in being mixed with a foreign material injected for magnetic susceptibility matching may occur, a manufacturing process is complicated, and monitoring performance may be degraded.

On the other hand, an air bubble generation problem may be overcome in the second container 110 of FIG. 4 according to an exemplary embodiment by injecting the matching liquid 113 in a liquid state. Also, as described above, by injecting the matching liquid 113 corresponding to the sample 123, a manufacturing process may be simplified and noise may be reduced at the same time.

Also, referring to FIG. 4, by designing the width of the insertion wire 140 to be thicker than that of the RF coil 130 by a predetermined level or more, the RF coil 130 may be placed at the center of the first container 120 even without a separate material for supporting the RF coil 130.

Hereinafter, implementable forms of the second container 110 and the first container 120 will be described in detail.

Figure 6:
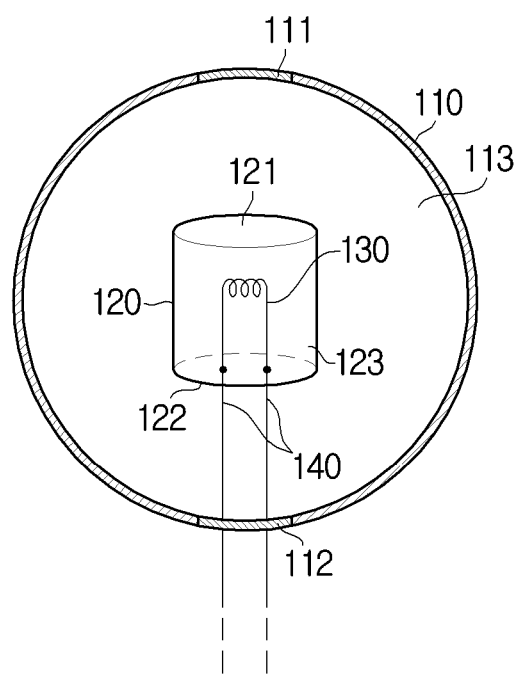
FIG. 6 is a view schematically illustrating a magnetic field monitoring probe in which the first container is implemented in a spherical shape according to an exemplary embodiment.

FIG. 6 is a view schematically illustrating a magnetic field monitoring probe in which the first container is implemented in a spherical shape according to an exemplary embodiment. Also, FIGS. 7 and 8 are views illustrating a magnetic field monitoring probe in which the first container and the second container are implemented in a spherical shape from different aspects.

Referring to FIG. 6, the second container 110 may be implemented in a spherical shape, in addition to a cylindrical shape. When the second container 110 is implemented in a spherical shape, an advantage exists in that uniformity of a magnetic field of the sample 123 can be maintained even when a direction of a central axis of the magnetic field monitoring probe 100 is not perpendicular to a static magnetic field direction.

Also, when the second container 110 is implemented in a spherical shape, a difference in magnetic susceptibility may be reduced when magnetic susceptibility of the sample 123 and magnetic susceptibility of air are not the same, and it may be more effective in terms of magnetic susceptibility matching.

Figure 7:
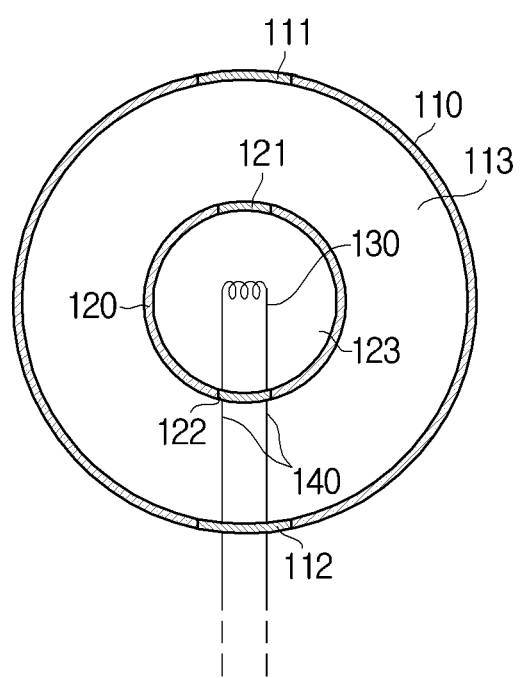
FIGS. 7 and 8 are views illustrating a magnetic field monitoring probe in which the first container and the second container are implemented in a spherical shape from different aspects.
Figure 8:
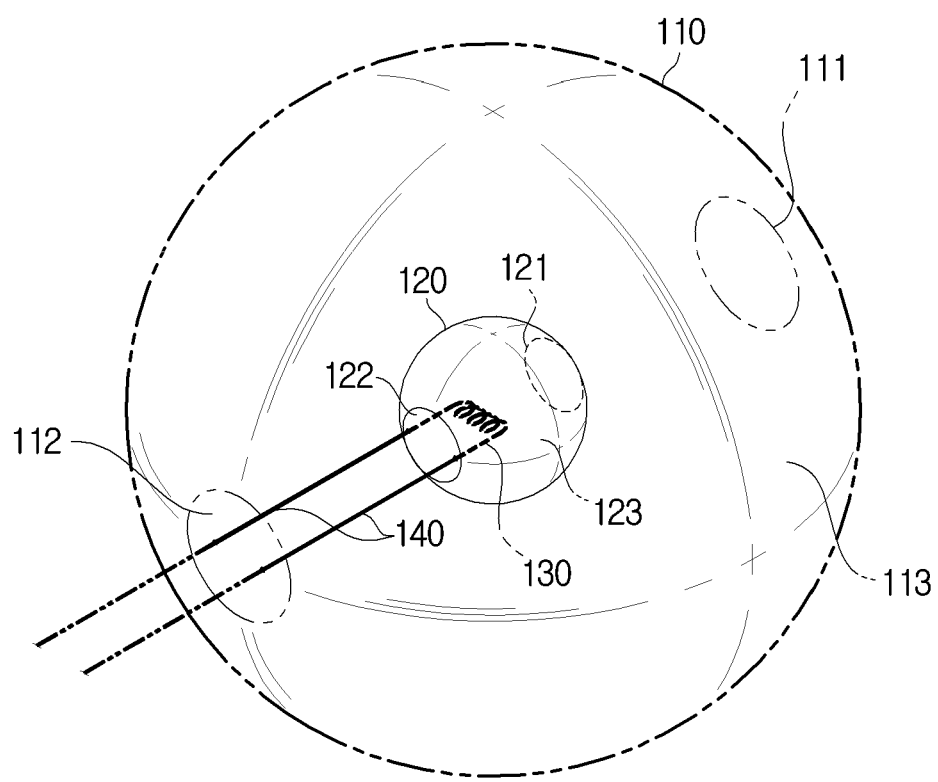

FIG. 7 is a view illustrating a cross-section of the magnetic field monitoring probe in which the first container and the second container are implemented in a spherical shape according to an exemplary embodiment, and FIG. 8 is a perspective view of the magnetic field monitoring probe in which the first container and the second container are implemented in a spherical shape according to an exemplary embodiment.

Referring to FIGS. 7 and 8, the first container 120 may be implemented in a spherical shape, in addition to a cylindrical shape, and the shape of the first container 120 is not limited. When the first container 120 is implemented in a spherical shape, an advantage exists in that uniformity of a magnetic field therein can be improved.

Also, the plugs 111 and 112 of the second container 110 and plugs 121 and 122 of the first container 120 may be implemented in a straight line shape as illustrated in FIG. 6, or may be implemented in a shape having a curvature corresponding to cross-sections of the first container 120 and the second container 110 as illustrated in FIG. 7. The shapes thereof are not limited thereto.

Hereinafter, a method of manufacturing a magnetic field monitoring probe will be described.

Figure 9:
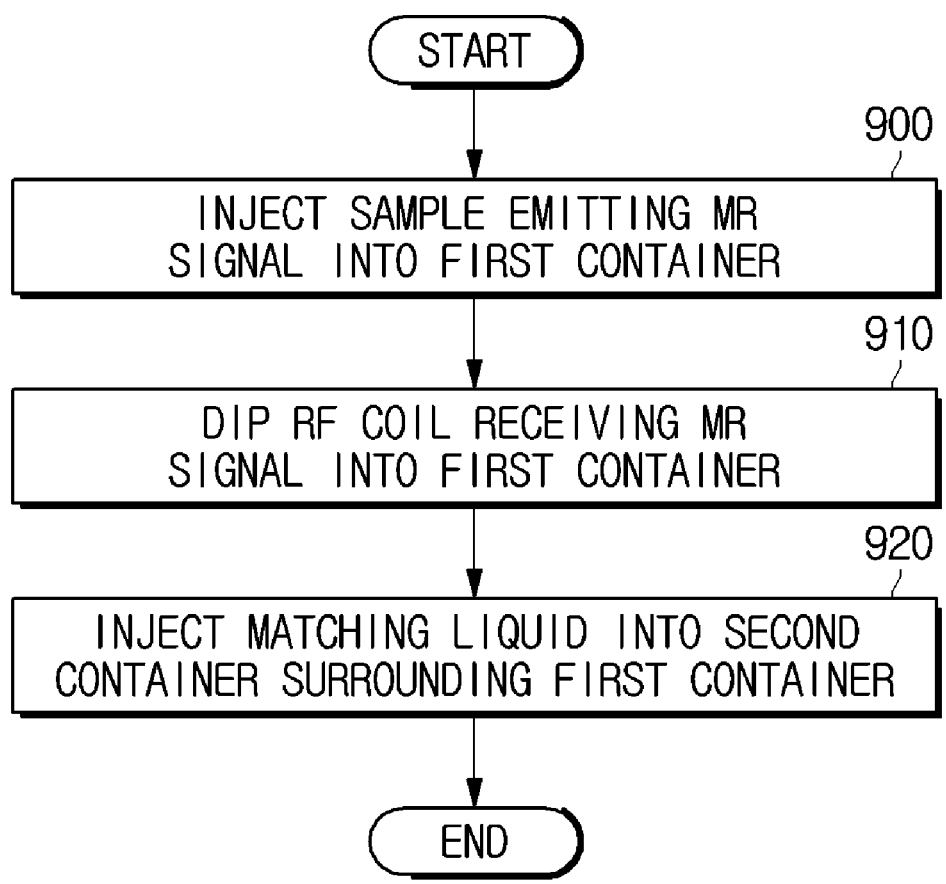
FIG. 9 is a view for describing an operational flow related to a method of manufacturing the magnetic field monitoring probe according to an exemplary embodiment.

FIG. 9 is a view for describing an operational flow related to a method of manufacturing the magnetic field monitoring probe according to an exemplary embodiment.

A first container in which a sample emitting an MR signal is injected may be manufactured. The first container may be implemented with a material having magnetic susceptibility that is identical to that of the sample or has a small difference from that of the sample. A hollow space may be provided inside the first container so that the sample and an RF coil are placed therein.

For example, when water is selected as the sample, the first container may be implemented with a solid material, such as graphite, having magnetic susceptibility similar to that of water. Moreover, the first container may be implemented with other various known solid materials having a small influence on uniformity of a magnetic field.

The first container may be implemented in a spherical shape, a cylindrical shape, or the like as described above. Also, the first container may include a plug configured to shield the first container after a sample is injected and an RF coil is inserted into the first container, and the shape of the plug is not limited.

A sample may be injected into the manufactured first container (900). Here, a liquid material that emits an MR signal at a specific MR frequency may be used as the sample. Also, an RF coil may be inserted into the first container and dipped in the sample (910). The sample may be injected after the RF coil is inserted into the first container. The manufacturing method is not limited to the order illustrated in FIG. 9. The RF coil may be connected to an electronic circuit via an insertion wire. Meanwhile, when both the sample and the RF coil are inserted into the first container, the plug may be attached to the first container to prevent the sample from leaking to the outside.

Also, a second container configured to support the first container into which the sample is injected and the RF coil inserted into the first container and having the insertion wire configured to support connection with an external circuit accommodated therein may be manufactured. The second container may be implemented in a shape, such as a cylindrical shape or a spherical shape described above, that may make a magnetic field uniform.

Here, a liquid material, instead of a solid material, may be injected into the second container, and the second container may be designed to have a hollow space to have the first container and the insertion wire provided therein. Also, a plug configured to shield the second container after the liquid material is injected thereinto may be provided at one side of the second container, and a plug may be provided also at an opposite side thereof.

Accordingly, a matching liquid may be injected into the second container surrounding the first container (920). The matching liquid serves as a buffer for preventing the sample from being affected by an external factor. A liquid capable of matching magnetic susceptibilities or impedances may be used as the matching liquid. After the matching liquid is injected into the second container, the plugs may be attached to the second container to prevent the matching liquid from leaking from the second container.

Also, the electronic circuit connected to the insertion wire may be implemented with various types of electronic parts configured to transmit an MR signal received through the RF coil. For example, the electronic circuit may be implemented as an impedance matching circuit, a high frequency amplifier, or the like, and may include an RF shield as necessary.

Figure 10:
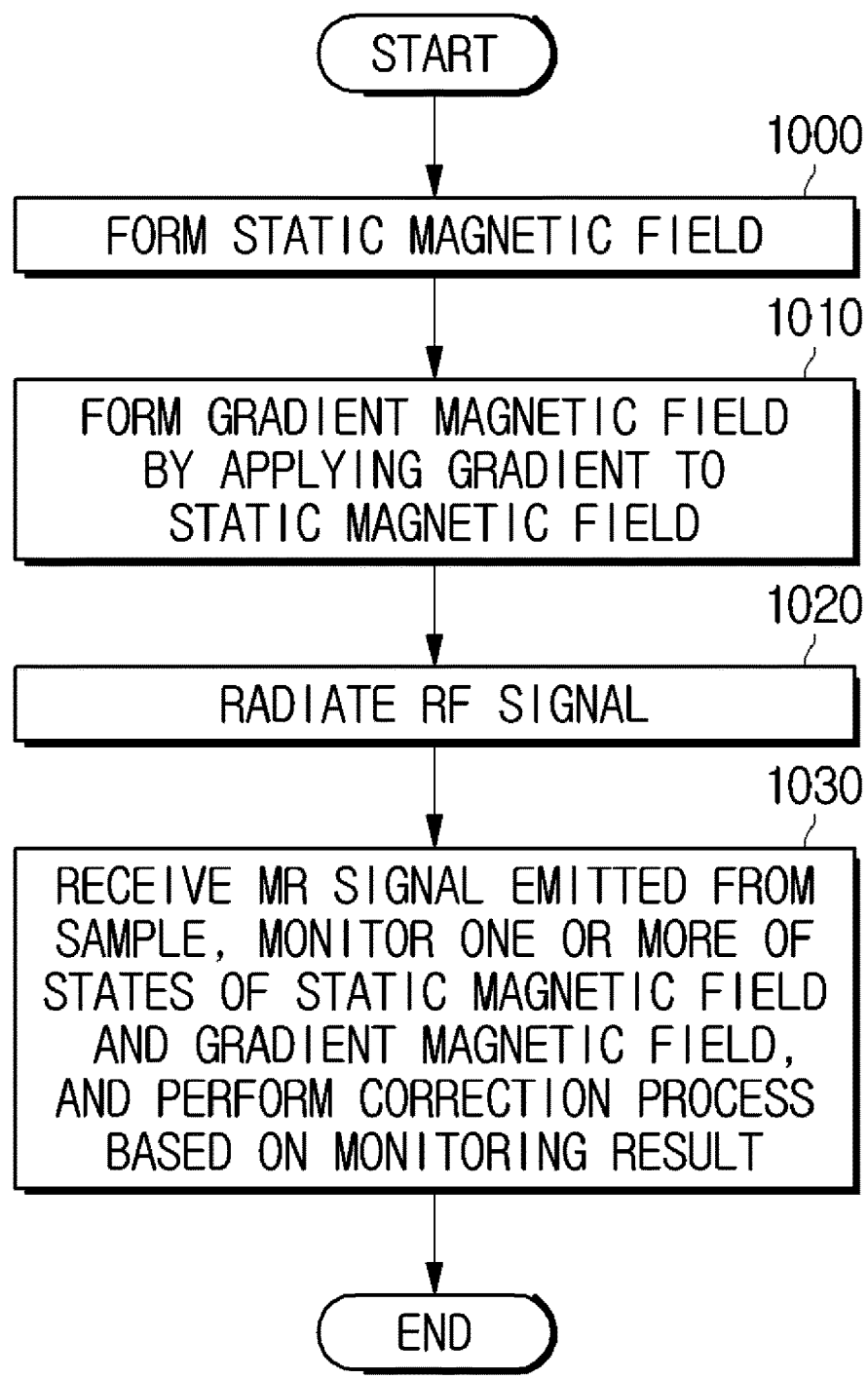
FIG. 10 is a view for describing an operational flow of an MRI apparatus that performs a correction process based on a monitoring result by the magnetic field monitoring probe according to an exemplary embodiment.

FIG. 10 is a view for describing an operational flow of an MRI apparatus that performs a correction process based on a monitoring result by the magnetic field monitoring probe according to an exemplary embodiment.

A static magnetic field former may be provided in the MRI apparatus and form a static magnetic field in an inner space of a scanner (1000). As described above, the static magnetic field former may be implemented with a permanent magnet, a superconducting magnet, and the like and form a static magnetic field in the inner space of the scanner.

Also, a gradient magnetic field former may be provided in the MRI apparatus and apply a gradient to the static magnetic field formed in the inner space of the scanner to form a gradient magnetic field. For example, the MRI apparatus may apply a pulse signal to an X-coil, a Y-coil, and a Z-coil forming a gradient magnetic field in an X-axis direction, a Y-axis direction, and a Z-axis direction perpendicular to one another to operate the X-coil, the Y-coil, and the Z-coil.

The MRI apparatus may form a gradient magnetic field by a current pulse as described above. However, a waveform or a form of a current pulse may be distorted due to a characteristic of an amplifier or characteristics of the X-coil, the Y-coil, and the Z-coil. Consequently, when a degree of distortion is identified from an MR signal emitted from a sample, i.e., when a degree of distortion is identified on the basis of a monitoring result, the MRI apparatus may apply a current pulse with a corrected waveform. In this way, a pulse of a desired form can be applied, and a more accurate medical image can be acquired.

Consequently, as will be described below, as one correction process, the MRI apparatus may identify a degree of distortion from an MR signal received from the RF coil and apply a pulse with a corrected form to improve uniformity of a gradient magnetic field. Also, as one correction process, the MRI apparatus may reflect a degree of distortion identified through monitoring in performing a post-process for acquiring a medial image to acquire a more high-quality medical image.

An RF coil may be provided in the MRI apparatus, and the RF coil may radiate an RF signal to an object present in the scanner and receive an MR signal emitted from the object. Here, when only one object is present in the scanner, e.g., when only the magnetic field monitoring probe is present therein, an MR signal emitted from a sample may be received through the RF coil provided inside the magnetic field monitoring prove. The magnetic field monitoring probe may transmit an MR signal received by a wired/wireless communication method to the controller 30 (see FIG. 1).

Also, when both the magnetic field monitoring probe and a human being are present in the scanner, an MR signal emitted from the sample may be received through the RF coil provided inside the magnetic field monitoring probe, and an MR signal emitted from a human body may be received by the RF coil portion 53 (see FIG. 1) or by a head coil, a spine coil, a torso coil, a knee coil or the like depending on a capturing portion. Here, a liquid having an MR frequency different from that of a source (e.g., hydrogen) from which the MR signal is emitted inside the human body is used as the sample injected into the magnetic field monitoring probe, and an interference between the sample and the source can be prevented.

The MRI apparatus may receive an MR signal emitted from the sample and monitor a state of a magnetic field and perform a correction process based on the monitoring result (1030). For example, the MRI apparatus may identify a state of a magnetic field by a magnetic field monitoring (MFM) process and perform a correction process on the basis of the identified state. The correction process includes various processes for improving quality of a medical image such as a process for correcting a form of a current pulse applied to the gradient magnetic field former and a process of reflecting a monitoring result in a post-process performed when acquiring a medical image.

According to an exemplary embodiment, the MRI apparatus may measure a phase change with time of an MR signal emitted from the sample. The MRI apparatus may compare a form of a current pulse applied to a pulse amplifier with a form of a phase change with time of an actually received MR signal and determine a degree of distortion of the current pulse. Then, the MRI apparatus may perform a correction process on the basis of a determined result.

For example, the MRI apparatus may pre-acquire an MR signal in an ideal state or a normal state when an RF signal is radiated. Next, the MRI apparatus may perform comparative analysis between the pre-acquired MR signal and an MR signal emitted as an RF signal is radiated to the sample while a magnetic field such as a static magnetic field, a gradient magnetic field, or the like is formed, and identify a degree of distortion.

According to an exemplary embodiment, the MRI apparatus may radiate an RF signal while only a static magnetic field is formed and then measure a phase of a received MR signal to identify one or more of an occurrence of distortion in the static magnetic field and a degree of the distortion according to whether a phase change is occurred.

In another exemplary embodiment, the MRI apparatus may measure a phase change of an MR signal received while a gradient magnetic field is formed and compare a measured phase change with a form of an applied current pulse to identify one or more of an occurrence of distortion in the gradient magnetic field and a degree of the distortion. Accordingly, the MRI apparatus may correct the form of the current pulse by reflecting the degree of distortion and apply the current pulse with a corrected form to a pulse amplifier. Also, the MRI apparatus may reflect the degree of distortion when performing a post-process to acquire a more accurate medical image.

Particularly, in a case of a high-speed imaging technique, such as echo planar imaging (EPI) or steady state free precession (SSFP), in which a duration of a gradient magnetic field pulse is long, quality of a medical image may be considerably degraded when a degree of distortion of a magnetic field is not corrected. Consequently, the MRI apparatus according to an exemplary embodiment may acquire a more accurate medical image by monitoring a degree of distortion and reflecting the monitoring result in a post-process.

An emission of an MR signal should be maintained for a certain amount of time to apply a pulse signal and determine a degree of distortion. Because a medical image is acquired from a signal, in which MR signals emitted from a plurality of atomic nuclei included in a sample are combined, an interference between MR signals should be minimized. Particularly, a trend of a phase change with time of an MR signal should be monitored to identify a state of a gradient magnetic field or a degree of distortion of a pulse for forming a gradient magnetic field. Here, when an amount of time in which an MR signal is acquired is too short, a phase change with time of an MR signal according to a gradient magnetic field cannot be identified.

For example, monitoring a state of a gradient magnetic field or a degree of distortion of a pulse signal may be normally performed when an attenuation time constant of an MR signal is 100 ms or higher. Consequently, the magnetic field monitoring probe according to an exemplary embodiment may improve monitoring performance by dipping an RF coil in a sample to make a distance between the RF coil and the sample short and using a liquid as a matching substance to increase receiving sensitivity and an attenuation time constant.

The exemplary embodiments may be implemented in a form of a computer readable recording medium in which a computer executable instruction and data are stored. The instruction may be stored in a form of a program code and generate a predetermined program module and perform a predetermined operation when executed by a processor. Also, when executed by the processor, the instruction may perform predetermined operations of the embodiments disclosed herein.

The exemplary embodiments have been described above with respect to the accompanying drawings. One of ordinary skill in the art to which the present disclosure pertains should understand that the present disclosure may be practiced in forms other than those of the disclosed embodiments without changing the technical spirit or essential features of the present disclosure. The embodiments disclosed herein are merely illustrative and should not be understood as limiting.

What is claimed is:

1. A magnetic field monitoring probe comprising:
    a first container having a sample configured to emit a magnetic resonance (MR) signal included therein;
    a radio frequency (RF) coil inserted into the first container and configured to receive an MR signal emitted from the sample; and
    a second container surrounding the first container and having a matching liquid injected thereinto.

2. The magnetic field monitoring probe of claim 1, wherein the first container and the second container are implemented in a spherical shape or a cylindrical shape.

3. The magnetic field monitoring probe of claim 1, wherein the RF coil is fixed to be placed at a center inside the first container by an insertion wire connected to the RF coil.

4. The magnetic field monitoring probe of claim 1, wherein the sample provided in the first container corresponds to any one of water, heavy water, and fluorine in a liquid state.

5. The magnetic field monitoring probe of claim 1, wherein a liquid that emits the MR signal at a resonance frequency different from the sample or does not emit the MR signal is the matching liquid.

6. The magnetic field monitoring probe of claim 1, wherein the matching liquid is comprised of a heavy water in a liquid state.

7. The magnetic field monitoring probe of claim 1, wherein the RF coil comprises a solenoid disposed at a center inside the first container.

8. A magnetic resonance imaging (MRI) apparatus comprising:
    a static magnetic field generator configured to form a static magnetic field;
    a gradient magnetic field generator configured to form a gradient magnetic field by applying a gradient to the static magnetic field;
    a radio frequency (RF) coil portion configured to radiate an RF signal;
    a magnetic field monitoring probe including a first container having a sample configured to receive the RF signal and emit an MR signal injected thereinto and a second container surrounding the first container, and configured to receive the MR signal emitted from the sample through an RF coil inserted into the first container; and
    a controller configured to monitor one or more of states of the static magnetic field and the gradient magnetic field based on the received MR signal and perform a correction process based on a monitoring result.

9. The MRI apparatus of claim 8, wherein a matching liquid for magnetic susceptibility matching is injected into the second container of the magnetic field monitoring probe.

10. The MRI apparatus of claim 8, wherein the controller generates a corrected current pulse on the basis of the monitoring result and controls a gradient magnetic field to be formed based on the generated current pulse.

11. A method of manufacturing a magnetic field monitoring probe, the method comprising:
    injecting a sample configured to emit a magnetic resonance (MR) signal, into a first container;
    dipping a radio frequency (RF) coil configured to receive an MR signal emitted from the sample, in the first container; and
    injecting a matching liquid into a second container surrounding the first container.

12. The method of claim 11, wherein the dipping includes connecting an insertion wire to the RF coil to fix the RF coil to be placed at a center inside the first container.

13. The method of claim 11, wherein the injecting the matching liquid into the second container includes selecting any one of liquids that emits the MR signal at a resonance frequency different from the sample or does not emit the MR signal as the matching liquid, and injecting the selected matching liquid into the second container.

* * * * *